United States Patent
Lin

(10) Patent No.: US 12,259,759 B2
(45) Date of Patent: Mar. 25, 2025

(54) SUPPORT DEVICE AND FOLDABLE DEVICE HAVING SAME

(71) Applicant: GOOGLE LLC, Mountain View, CA (US)

(72) Inventor: Chihung Lin, New Taipei (TW)

(73) Assignee: Google LLC, Mountain View, CA (US)

( * ) Notice: Subject to any disclaimer, the term of this patent is extended or adjusted under 35 U.S.C. 154(b) by 665 days.

(21) Appl. No.: 17/250,676

(22) PCT Filed: Apr. 24, 2019

(86) PCT No.: PCT/US2019/029018
§ 371 (c)(1),
(2) Date: Feb. 18, 2021

(87) PCT Pub. No.: WO2020/219043
PCT Pub. Date: Oct. 29, 2020

(65) Prior Publication Data
US 2021/0216109 A1    Jul. 15, 2021

(51) Int. Cl.
*G06F 1/16* (2006.01)
*F16C 11/04* (2006.01)
(Continued)

(52) U.S. Cl.
CPC .......... *G06F 1/1675* (2013.01); *F16C 11/045* (2013.01); *G06F 1/1652* (2013.01);
(Continued)

(58) Field of Classification Search
CPC ..... G06F 1/1675; G06F 1/1681; G06F 1/1652
See application file for complete search history.

(56) References Cited

U.S. PATENT DOCUMENTS 9,173,287 B1 * 10/2015 Kim ...................... G06F 1/1652
9,348,362 B2 * 5/2016 Ko .......................... G06F 1/1601
(Continued)

FOREIGN PATENT DOCUMENTS

CN 204878290 U 12/2015
CN 105788457 A1 7/2016
(Continued)

OTHER PUBLICATIONS

International Search Report and Written Opinion for Application No. PCT/US2019/029018, mailed on Jan. 13, 2020, 11 pages.
(Continued)

*Primary Examiner* — Rockshana D Chowdhury
*Assistant Examiner* — Douglas R Burtner
(74) *Attorney, Agent, or Firm* — Shumaker & Sieffert, P.A.

(57) ABSTRACT

A foldable device may include a foldable layer and a support device that is fixed to a foldable portion, or bendable section, of the foldable layer. The support device may include a plurality of links, or segments. Each of the plurality of links may be individually fixed to a surface of the foldable portion of the foldable layer. Each of the plurality of links may be movably coupled to an adjacent link of the plurality of links, such that the plurality of links move relative to each other, while remaining fixed to the foldable layer, in response to a folding movement of the foldable layer and an unfolding movement of the foldable layer.

16 Claims, 13 Drawing Sheets

(51) Int. Cl.
*H04M 1/02* (2006.01)
*H10K 50/84* (2023.01)
*H10K 102/00* (2023.01)

(52) U.S. Cl.
CPC .......... *H04M 1/0268* (2013.01); *H10K 50/84* (2023.02); *H10K 2102/311* (2023.02)

(56) References Cited

U.S. PATENT DOCUMENTS

| | | | | |
|---|---|---|---|---|
| 9,798,359 | B2* | 10/2017 | Seo | G06F 1/1652 |
| 9,992,888 | B2* | 6/2018 | Moon | G06F 1/1652 |
| 10,754,395 | B2* | 8/2020 | Sanchez | H05K 5/0086 |
| 10,975,603 | B2* | 4/2021 | Tazbaz | G06F 1/1616 |
| 11,372,453 | B2* | 6/2022 | Yu | G06F 9/30 |
| 11,575,778 | B2* | 2/2023 | Cheng | G06F 1/1681 |
| 11,973,890 | B2* | 4/2024 | Zhang | H04M 1/0268 |
| 2015/0241925 | A1* | 8/2015 | Seo | G06F 1/1652 |
| | | | | 361/679.27 |
| 2015/0361696 | A1* | 12/2015 | Tazbaz | E05D 3/06 |
| | | | | 361/679.27 |
| 2016/0370829 | A1* | 12/2016 | Hsu | G06F 1/1681 |
| 2017/0142847 | A1* | 5/2017 | Park | H05K 5/0226 |
| 2018/0242446 | A1* | 8/2018 | Cho | G06F 1/1681 |
| 2019/0086962 | A1* | 3/2019 | Shin | G06F 1/1652 |
| 2019/0179373 | A1* | 6/2019 | Cheng | H04M 1/0216 |
| 2020/0029449 | A1* | 1/2020 | Makinen | H05K 5/0217 |
| 2020/0383219 | A1* | 12/2020 | Hale | E05D 3/122 |
| 2021/0037664 | A1* | 2/2021 | Sun | E05D 3/18 |
| 2021/0216103 | A1* | 7/2021 | Chen | G06F 1/1652 |
| 2023/0095925 | A1* | 3/2023 | Kim | G06F 1/1681 |
| | | | | 361/679.01 |
| 2023/0185338 | A1* | 6/2023 | Seo | G06F 1/1652 |
| | | | | 361/679.28 |
| 2023/0213967 | A1* | 7/2023 | Kang | G06F 1/1624 |
| | | | | 455/575.4 |

FOREIGN PATENT DOCUMENTS

| | | |
|---|---|---|
| CN | 107533341 A1 | 1/2018 |
| CN | 108122492 A | 6/2018 |
| CN | 108712529 A | 10/2018 |

OTHER PUBLICATIONS

International Preliminary Report on Patentability from International Application No. PCT/US2019/029018 dated Sep. 28, 2021, 6 pp.
First Office Action and Search Report, and translation thereof, from counterpart Chinese Application No. 201980061481.8 dated Jan. 8, 2024, 30 pp.
Second Office Action and Search Report, and translation thereof, from counterpart Chinese Application No. 201980061481.8 dated May 29, 2024, 28 pp.

* cited by examiner

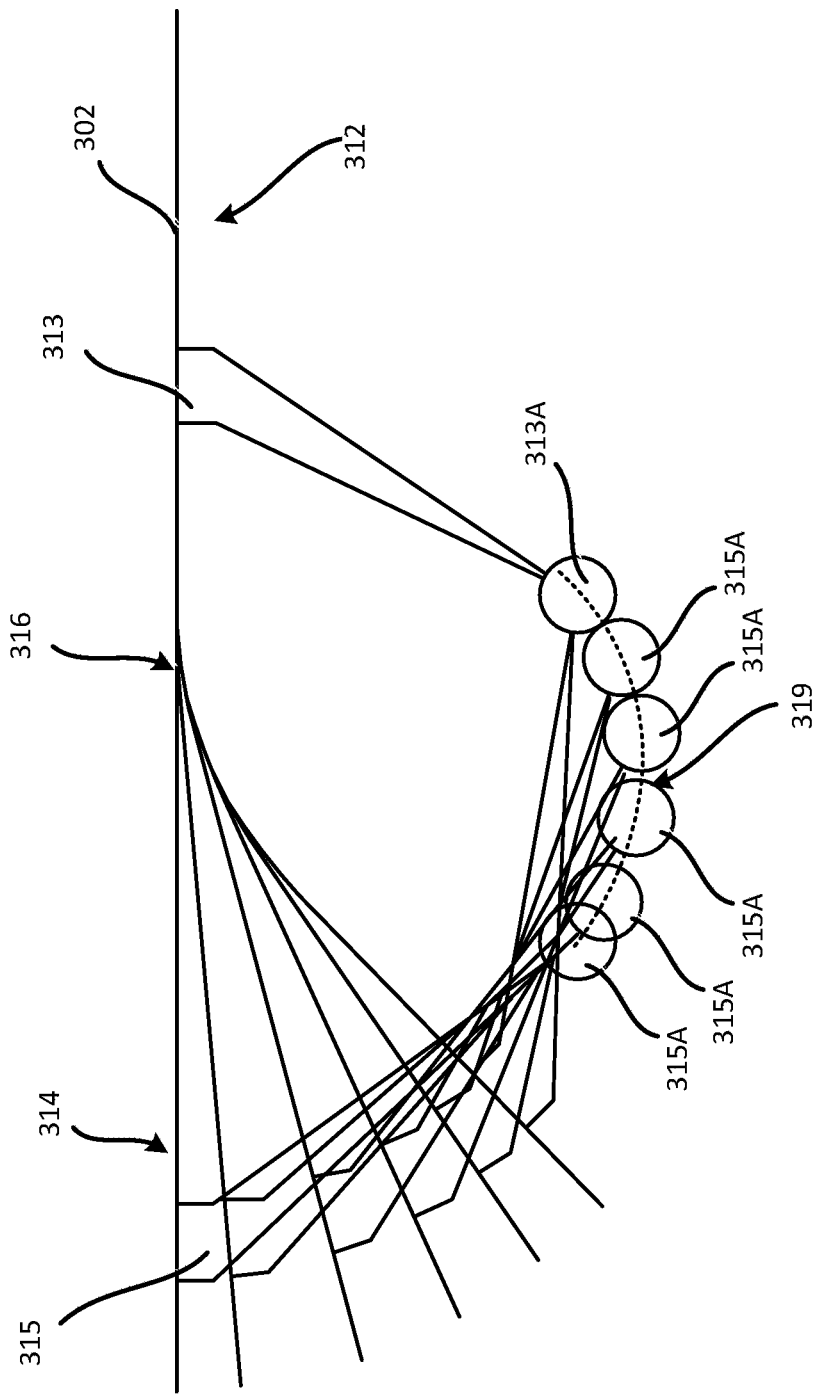

SUPPORT DEVICE AND FOLDABLE DEVICE HAVING SAME

CROSS REFERENCE TO RELATED APPLICATIONS

This application is a 35 U.S.C. § 371 National Phase Entry Application from International Patent Application No. PCT/US19/29018, filed on May 29, 2019, entitled "SUPPORT DEVICE AND FOLDABLE DEVICE HAVING SAME," the disclosure of which is incorporated herein in its entirety.

TECHNICAL FIELD

This description relates, generally, to support devices for a foldable device, and, in particular, to support devices, such as chain support devices/systems, supporting foldable display systems.

BACKGROUND

Modern computing devices often attempt to achieve a balance between portability and functionality. The desire for a device that provides for a rich display of information on a single surface (suggesting a device having a relatively large form factor) may conflict with the desire to have a device that is small enough to be easily carried and easily accessible (suggesting a device having a relatively small form factor). A flexible, or foldable, display may enhance the capabilities of a computing device, in that, in a folded configuration, the device may have a relatively small form factor, and in an unfolded configuration, the device may take advantage of a relatively large display area. Support in a bending area of the display may maintain a desired contour, or curvature, of the display in the bending area. This type of support in the bending area may prevent damage to the display due to excessive compression and/or tension which may be exerted on components of the display, particularly if the foldable display is bent outside of an allowable bend radius range in both the folded and the unfolded configuration.

SUMMARY

In a general aspect, a foldable device includes a foldable layer and a support device fixed to a foldable portion of the foldable layer. The support device include a plurality of links, and each of the plurality of links is individually fixed to a surface of the foldable portion of the foldable layer. Each of the plurality of links is movably coupled to an adjacent link of the plurality of links, such that the plurality of links move relative to each other, while remaining fixed to the foldable layer, in response to a folding movement of the foldable layer and an unfolding movement of the foldable layer.

Implementations can include one or more of the following features, in isolation, or in any combination with each other.

For example, each link of the plurality of links can include a coupling portion fixed to the foldable layer, a pin extending outward from the coupling portion, and a slot formed in the coupling portion and configured to slidably receive the pin of an adjacent link of the plurality of links.

For each link of the plurality of links, a first end portion of the coupling portion can be fixedly coupled to the foldable layer, and the pin can extend outward, substantially orthogonally, from a first side portion of a second end portion of the coupling portion, and the slot can be an arcuate slot formed in a second side portion of the second end portion of the coupling portion, so as to guide movement of the pin of the adjacent link through a folding and an unfolding of the foldable layer.

Each link of the plurality of links can be configured such that in an unfolded position of the foldable layer, the pin is slidably received in the slot of the adjacent link and the pin is positioned at a first end of the slot formed in the adjacent link and such that in a folded position of the foldable layer, the pin is slidably received in the slot of the adjacent link and the pin is positioned at a second end of the slot formed in the adjacent link.

Each link of the plurality of links can include a support member extending between a first edge portion of the foldable layer and a second edge portion of the foldable layer, a first coupling portion at a first end of the support member, and a second coupling portion at a second end of the support member.

The first coupling portion and the second coupling portion each can include a first end portion fixedly coupled to the foldable layer, a second end portion opposite the first end portion, a pin extending outward from the second end portion, and an arcuate slot formed in the second end portion and configured to slidably receive the pin of an adjacent link of the plurality of links, so as to guide movement of the pin of the adjacent link through a folding and an unfolding of the foldable layer.

Each link of the plurality of links can be configured such that in an unfolded position of the foldable layer, the pin is slidably received in the slot of the adjacent link and the pin is positioned at a first end of the slot formed in the adjacent link, and in a folded position of the foldable layer, the pin is slidably received in the slot of the adjacent link and the pin is positioned at a second end of the slot formed in the adjacent link.

The slot can be configured such that the position of the pin at the first end of the slot restricts further unfolding movement of the foldable layer, and the position of the pin at the second end of the slot restricts further folding movement of the foldable layer.

The support device can include a chain module including the plurality of links, a first bracket fixed to the foldable layer at a first end portion of the chain module, and a second bracket fixed to the foldable layer at a second end portion of the chain module.

The first bracket can include a base portion fixedly coupled to the foldable layer, a linking arm extending outward from the body, and a slot formed in the linking arm and configured to receive the pin of an adjacent link at the first end portion of the chain module. The second bracket can includes a base portion fixedly coupled to the foldable layer, a linking arm extending outward from the base portion, and a pin extending outward from the linking arm and configured to engage a slot of an adjacent link at the second end portion of the chain module.

The foldable layer can include a flexible OLED display device.

The support device can be configured to prevent the foldable layer from bending beyond a minimum bending radius.

The support device can be configured to prevent the foldable layer from bending beyond a maximum bending radius.

In another general aspect, a foldable display device includes a foldable OLED display layer, and a support device fixed to a foldable portion of the foldable OLED display layer, wherein the support device is configured to prevent the foldable OLED display layer from bending beyond a minimum bending radius. The support device includes a plurality of links, where each of the plurality of links is individually fixed to a surface of the foldable portion of the foldable OLED display layer, and each of the plurality of links is movably coupled to an adjacent link of the plurality of links, such that the plurality of links move relative to each other, while remaining fixed to the foldable OLED display layer, in response to a folding movement of the foldable OLED display layer and an unfolding movement of the foldable OLED display layer.

Implementations can include one or more of the following features, in isolation, or in any combination with each other.

Each link of the plurality of links can include a coupling portion fixed to the foldable OLED display layer, a pin extending outward from the coupling portion, and a slot formed in the coupling portion and configured to slidably receive the pin of an adjacent link of the plurality of links.

For each link of the plurality of links, a first end portion of the coupling portion can be fixedly coupled to the foldable OLED display layer, and the pin can extend outward, substantially orthogonally, from a first side portion of a second end portion of the coupling portion, and the slot can be an arcuate slot formed in a second side portion of the second end portion of the coupling portion, so as to guide movement of the pin of the adjacent link through a folding and an unfolding of the foldable OLED display layer.

Each link of the plurality of links can be configured such that in an unfolded position of the foldable OLED display layer, the pin is slidably received in the slot of the adjacent link and the pin is positioned at a first end of the slot formed in the adjacent link, and in a folded position of the foldable OLED display layer, the pin is slidably received in the slot of the adjacent link and the pin is positioned at a second end of the slot formed in the adjacent link.

Each link of the plurality of links can include a support member extending between a first edge portion of the foldable OLED display layer and a second edge portion of the foldable OLED display layer, a first coupling portion at a first end of the support member, and a second coupling portion at a second end of the support member.

The first coupling portion and the second coupling portion each can include a first end portion fixedly coupled to the foldable OLED display layer, a second end portion opposite the first end portion, a pin extending outward from the second end portion, and an arcuate slot formed in the second end portion and configured to slidably receive the pin of an adjacent link of the plurality of links, so as to guide movement of the pin of the adjacent link through a folding and an unfolding of the foldable OLED display layer, and each link of the plurality of links can be configured such that in an unfolded position of the foldable OLED display layer, the pin is slidably received in the slot of the adjacent link and the pin is positioned at a first end of the slot formed in the adjacent link and in a folded position of the foldable OLED display layer, the pin is slidably received in the slot of the adjacent link and the pin is positioned at a second end of the slot formed in the adjacent link.

The support device can include a chain module that includes the plurality of links, a first bracket fixed to the foldable OLED display layer at a first end portion of the chain module, and a second bracket fixed to the foldable OLED display layer at a second end portion of the chain module.

The first bracket can include a base portion fixedly coupled to the foldable OLED display layer, a linking arm extending outward from the body, and a slot formed in the linking arm and configured to receive the pin of an adjacent link at the first end portion of the chain module. The second bracket can include a base portion fixedly coupled to the foldable OLED display layer, a linking arm extending outward from the base portion, and a pin extending outward from the linking arm and configured to engage a the slot of an adjacent link at the second end portion of the chain module.

BRIEF DESCRIPTION OF THE DRAWINGS

FIGS. 3, 4A and 4B are schematic illustrations of movement of a rigid section of a foldable layer relative to a foldable portion or bending section of the foldable layer, in accordance with implementations described herein.

DETAILED DESCRIPTION

Figure 1A:
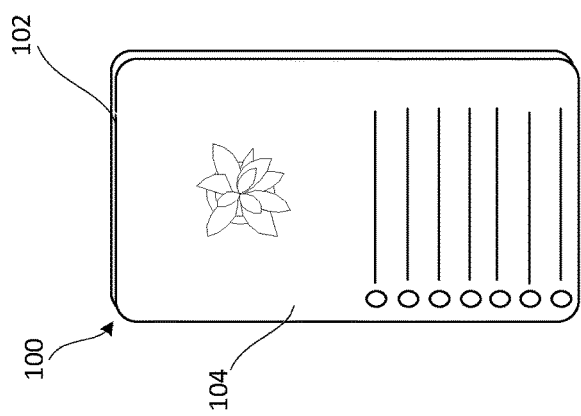
FIGS. 1A-1C illustrate an exemplary computing device including an exemplary foldable display.
Figure 1B:
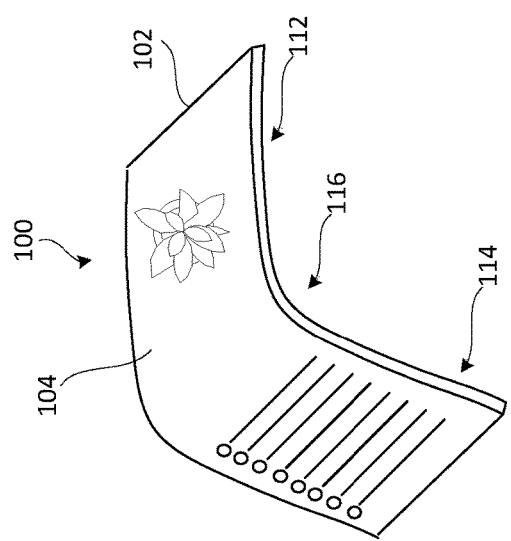
Figure 1C:
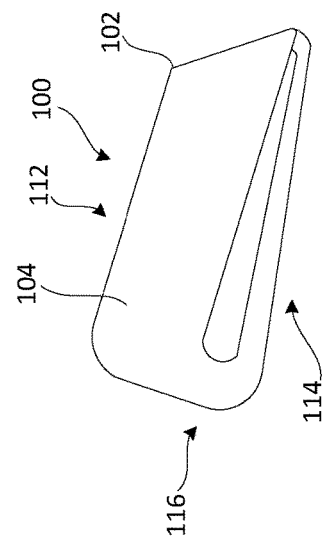

FIGS. 1A-1C illustrate an exemplary computing device 100 that includes a foldable layer 102. FIG. 1A is a front view of the exemplary computing device 100 in an unfolded configuration. FIG. 1B is a perspective view of the exemplary computing device 100 in a partially folded configuration. FIG. 1C is a side view of the exemplary computing device 100 in a fully folded configuration. In the exemplary computing device 100 shown in FIGS. 1A-1C, the foldable layer 102 is a foldable display 102 that is mounted so that a display surface 104 faces outward in the folded configuration. The foldable layer 102 can include a flexible organic light emitting diode (OLED) layer. In some implementations, the foldable display 102 may be mounted on the computing device 100 so that the display surface 104 faces inward when the device 100 is in the folded configuration (not shown). In some implementations, the foldable display 102 can include a first relatively flat, relatively rigid, or -semi-rigid, section 112, a second relatively flat, relatively rigid, or semi-rigid, section 114, and a foldable portion or bendable section 116. In some implementations, the foldable display 102 can include more than two flat, rigid sections 112, 114 and/or more than one bendable section 116. In some implementations, the foldable display 102 can include zero, or only one, flat rigid section 112, 114. For example, when a foldable display 102 includes zero flat rigid sections, the display 102 may be substantially continuously bendable, and may be rolled up, as in a scroll. The exemplary foldable display 102 shown in FIGS. 1A-1C includes a bendable section 116 that allows the foldable display 102 to bend about an axis. In some implementations, the foldable display 102 can include one or more bendable sections that allow the foldable display 102 to bend about more than one axis.

In the exemplary computing device 100 shown in FIGS. 1A-1C, the bendable section 116 may allow the foldable display 102 to bend, or fold, for example, in an arcuate shape, that has a bending radius, and/or radius of curvature. In some implementations, support may be provided in the bendable section 116. A support device, in accordance with implementations described herein, may provide support in the foldable portion or bendable section 116 in both the folded and unfolded configurations. In some implementations, a support device, in accordance with implementations described herein, may support and guide the folding or bending of the foldable display 102 in the foldable portion or bendable section 116, and may prevent the foldable display 102 from bending beyond a minimum bending radius (e.g., less than 10 millimeters, less than 5 millimeters, or less than 2 millimeters) and/or from bending beyond a maximum bending radius, or radius of curvature that may cause damage to fragile components of the foldable display 102.

Figure 2A:
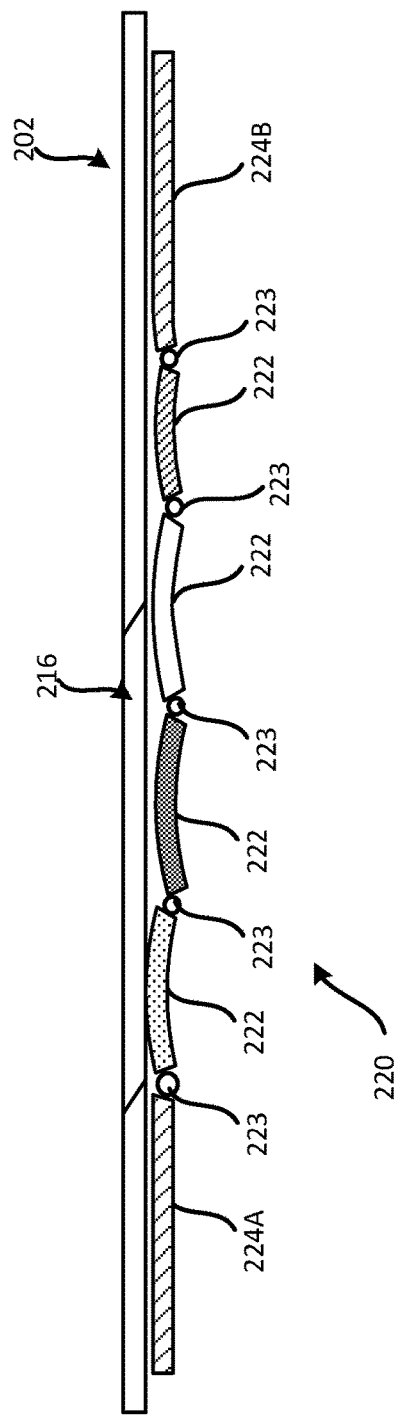
FIGS. 2A and 2B illustrate an exemplary support device of an exemplary foldable display.
Figure 2B:
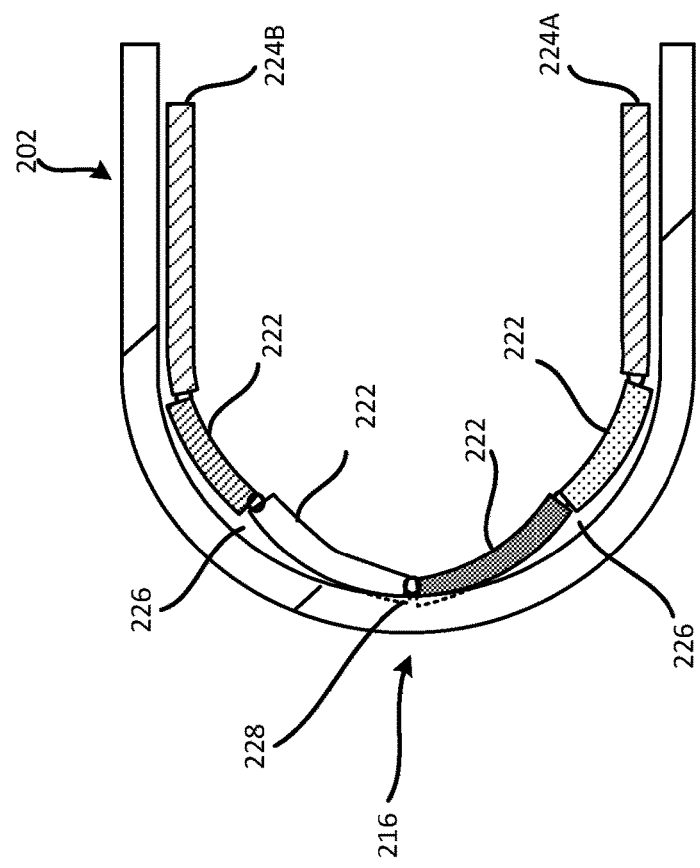

For example, an exemplary support device 220 supporting an exemplary foldable layer 202, such as, for example, a foldable display 202 in the unfolded configuration is illustrated in FIG. 2A. In FIG. 2B, the exemplary support device 220 supports the exemplary foldable layer 202 in the folded configuration. In the example illustrated in FIGS. 2A and 2B, the exemplary support device 220 includes a plurality of segments 222, arranged sequentially so as to provide support to a bending section 216 of the foldable layer 202. A first end segment 224A is positioned at a first end of the plurality of segments 222, and a second end segment 224B is positioned at a second end of the plurality of segments 222. In this arrangement, the plurality of segments 222 may be coupled to each other by one or more coupling devices 223 so as to allow for movement, or change in orientation, of the plurality of segments 222 as the foldable layer 202 is folded and unfolded. However, because the foldable layer 202 and the support device 220 are independent from each other (in particular, the segments 222 may be movably coupled to each other, but not to the foldable layer 202), the support provided by this exemplary support device 220 is not necessarily uniform throughout the bending section 216 of the foldable layer 202. That is, because in this arrangement, the segments 222 are movable relative to each other, and also relative to the foldable layer 202, the segments 222 may move non-uniformly in response to the folding and unfolding of the foldable layer 202, causing irregularity, or distortion in the contour of support device 220. For example, as shown in FIG. 2B, gaps 226 may be formed between the foldable layer 202 and the segments 222 as the segments 222 move in response to the folding and unfolding of the foldable layer 202. The gaps 226 may represent unsupported portions or regions of the foldable layer 202. In some situations, movement of the segments 222 as the foldable layer 202 is folded and unfolded may cause the segments 222 to be positioned such that the segments 222 impinge, or exert localized pressure, on a portion 228 of the foldable layer 202, which may damage components of the foldable layer 202. In addition, due to the irregularity or distortion in the contour of the support device 220 when folding and unfolding of the foldable layer 202, the support provided by the support device 220 may not by uniform across the foldable portion 216 which can impact negatively a user's experience when interacting with the foldable layer 202 (e.g. a foldable display). For example, the user may feel the support for the foldable layer 202 is stronger in some parts of the foldable portion 216 compared to other parts.

In accordance with implementations described herein, a foldable device comprises a foldable layer and a support device (or chain support device) fixed to a foldable portion (or bendable section) of the foldable layer. The support device includes a plurality of links (or segments or link members), wherein each of the plurality of links is individually fixed to a surface of the foldable portion of the foldable layer. Each of the plurality of links is movably coupled to an adjacent link of the plurality of links, such that the plurality of links move relative to each other, while remaining fixed to the foldable layer, in response to a folding movement of the foldable layer and an unfolding movement of the foldable layer. Movement of the segments or links relative to each other may be guided by a guide device. The support device may provide support to the foldable layer in a substantially full range of positions between a fully unfolded configuration and a fully folded configuration. In some implementations, the support device may include a guide device that guides the relative movement of the segments or links relative to each other. In some implementations, the guide device may include a series of pins, or shafts, received in guide slots, or guide rails, to guide the relative movement of the segments, or links. In some implementations, the guide device may limit a degree, or magnitude, of folding and/or unfolding of the foldable layer to prevent damage to components of the foldable layer. In developing a configuration of a support device for a foldable layer, in accordance with implementations described herein, movement of the various sections of the foldable layer may be taken into consideration. This will be described below with respect to FIGS. 3-5.

Figure 3:
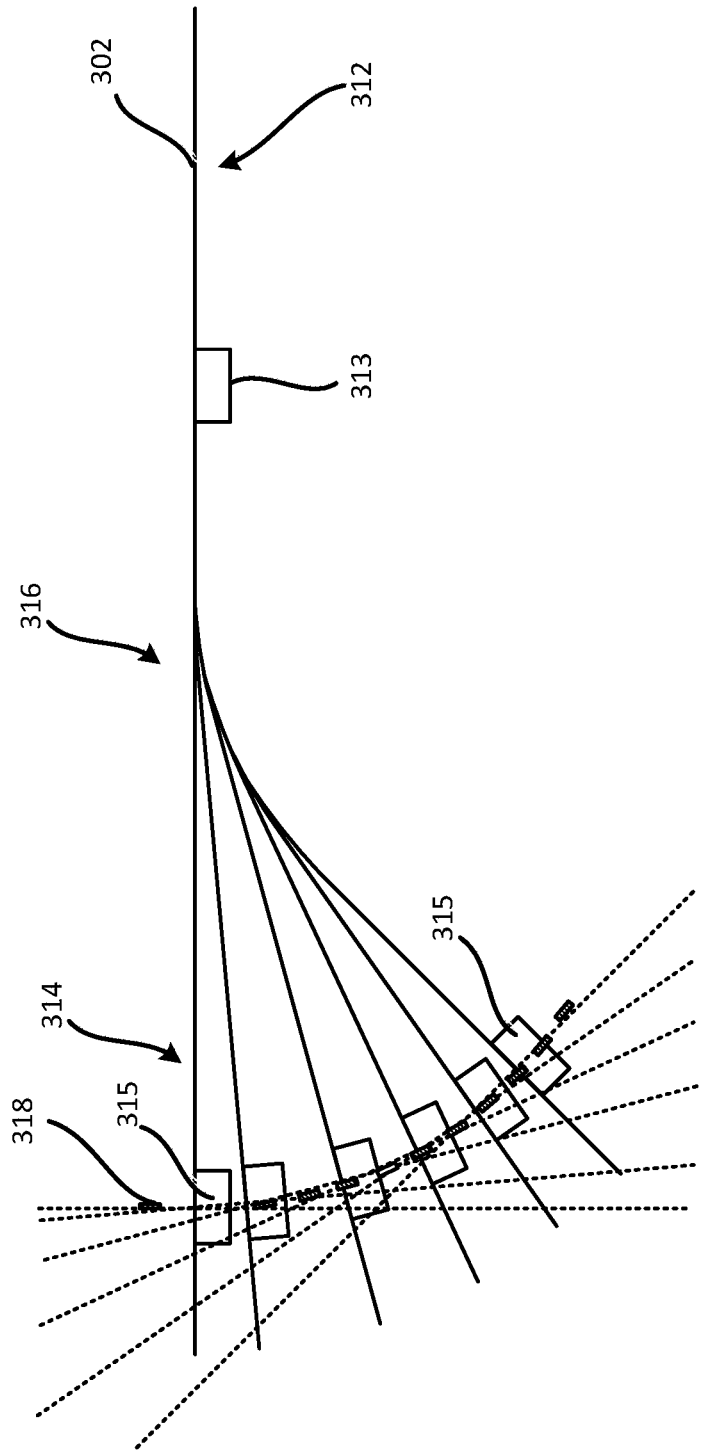

FIGS. 3-5 schematically illustrate a track, or a trace, of an object on a foldable plane 302, such as, for example, a foldable display 302, as the foldable plane 302 is folded and unfolded. In particular, as shown in FIG. 3, the foldable plane 302 may include a first section 312 and a second section 314. A first object 313 is identified on the first section 312 and a second object 315 is identified on the second section 314 of the foldable plane 302, for purposes of tracing the motion of the object(s) 313, 315 as the foldable plane 302 is folded/unfolded. In the example shown in FIG. 3, the second section 314 is moved toward the first section 312 (to, for example, fold the foldable plane 302 about a foldable portion or bending section 316 of the foldable plane 302). A trace 318 of a center point of the object 315 tracks the path followed by the object 315 as the foldable plane 302 is folded (i.e., as the second section 314 is bent, or is rotated about the bending section 316, every 10 degrees (other angle values may alternatively be used, such as 5 degrees or 1 degree) and moved toward the first section 312 of the foldable plane 302). This trace 318 represents the non-linear path, or trajectory, of the object 315 (and by extension, the second section 314) as the foldable plane 302 is folded and unfolded about the bending section 316.

Figure 4B:
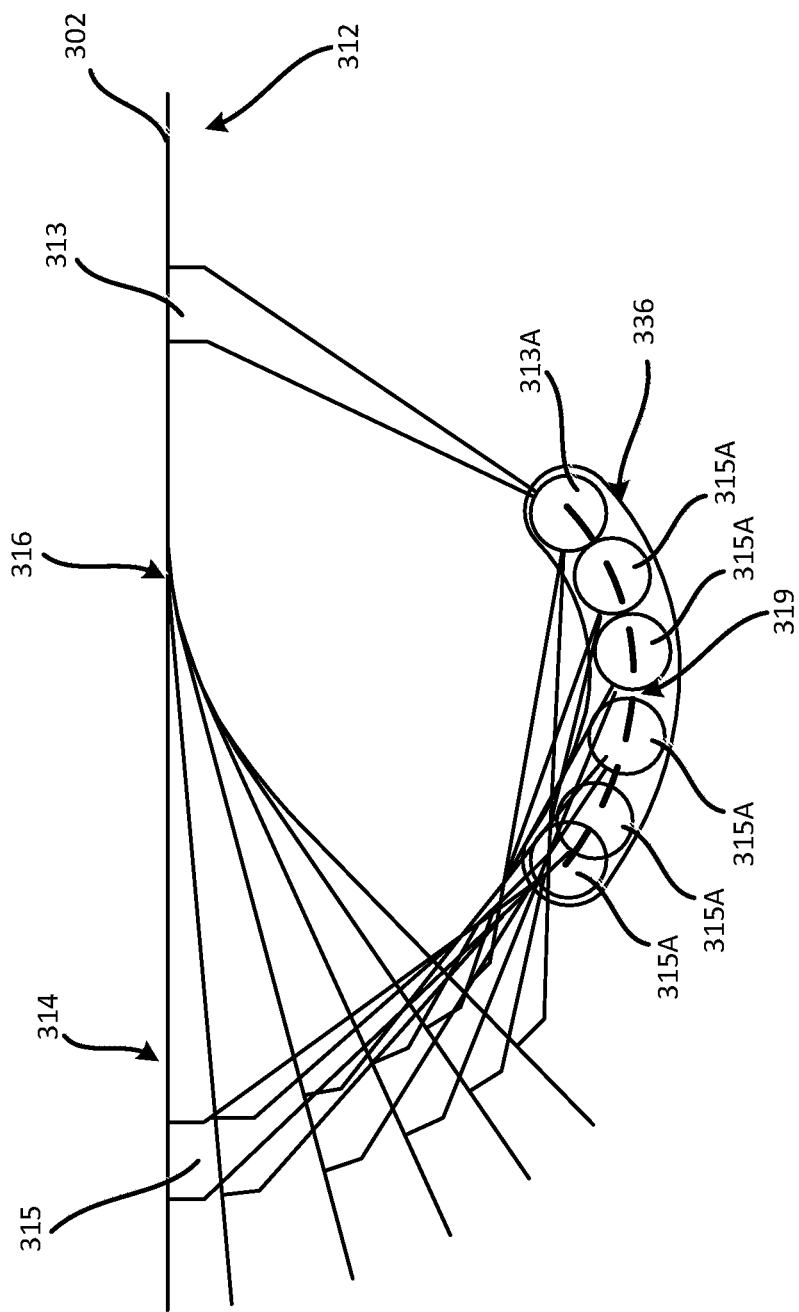
Figure 5A:
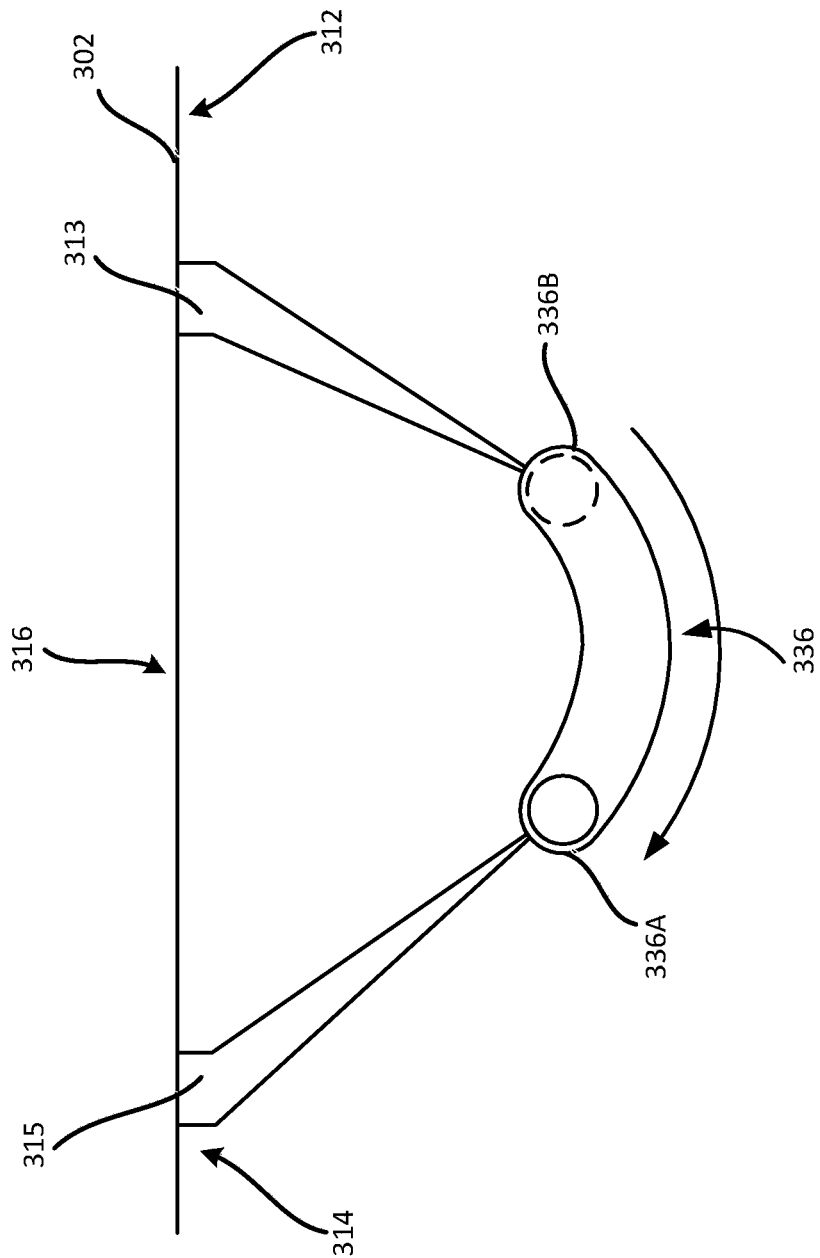
FIGS. 5A and 5B are schematic illustrations of a positioning of a pin in a slot through the movement illustrated in FIGS. 3 4A and 4B, in accordance with implementations described herein.
Figure 5B:
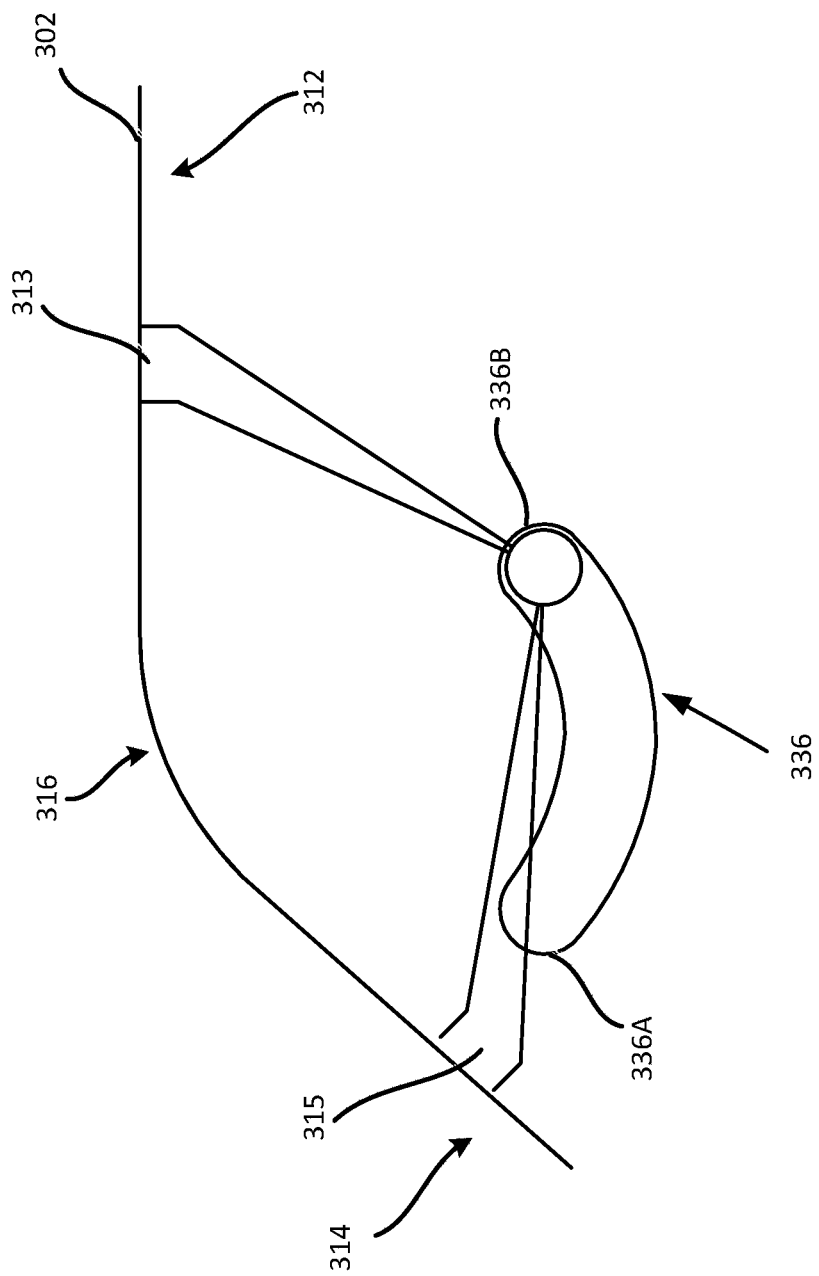

In order to reduce the irregularity or distortion in the contour of the support device so that the contour of the support device better matches the foldable layer as the foldable layer is folded and unfolded, simulations which track the rotation centers of the objects 313, 315 as the foldable layer is folded/unfolded can be performed and the results are shown in FIGS. 4A and 4B. Such simulations may be used to define the configuration of the support device in accordance with implementations described herein. In FIGS. 4A and 4B, the object 315 is expanded to represent an exemplary pin 315, or shaft 315. In this example, the trace 319 of the locations of the centers of rotation of the objects 313, 315 as the foldable layer 302 is folded/unfolded is determined by simulating the folding and unfolding of the foldable layer 302 with the objects 313 and 315 and determining the position of the centers of rotation of the objects 313, 315 at different angles (e.g. increments of 10 degrees or other values) as the foldable layer 302 is folded/unfolded. The determined trace 319 may be used to define a slot 336, or a guide 336, as shown in FIG. 4B, in which a pin (one of the circles 315A, 313A may be considered as a representation of the pin) may be received, to guide relative motion of the first and second sections 312, 314 of the foldable layer 302. In particular, in this example, the trace 319 may define a contour, and/or a length, and/or a shape and the like of the slot 336 that may guide the relative motion of the first and second sections 312, 314 of the foldable layer 302. FIGS. 5A and 5B illustrate exemplary motion, and corresponding position of the exemplary pin (represented by a circle in FIG. 5A and FIG. 5B) in the exemplary slot 336. That is, FIG. 5A illustrates the foldable layer 302 in an unfolded configuration, with the exemplary pin (represented by a circle) at a first position 336A in the exemplary slot 336. FIG. 5B illustrates the foldable layer 302 in a folded configuration, with the exemplary pin (represented by a circle) at a second position 336B in the exemplary slot 336.

Figure 6A:
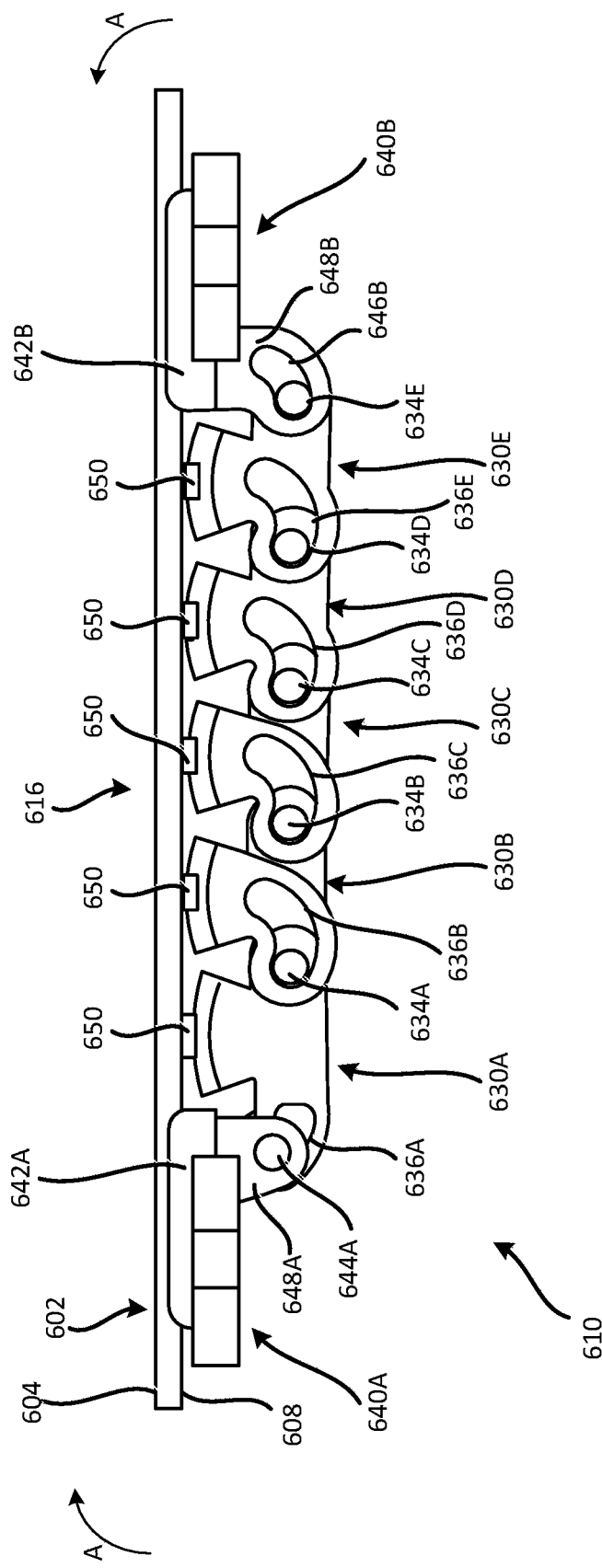
FIGS. 6A and 6B are side views of a support device, in accordance with implementations described herein.
Figure 6B:
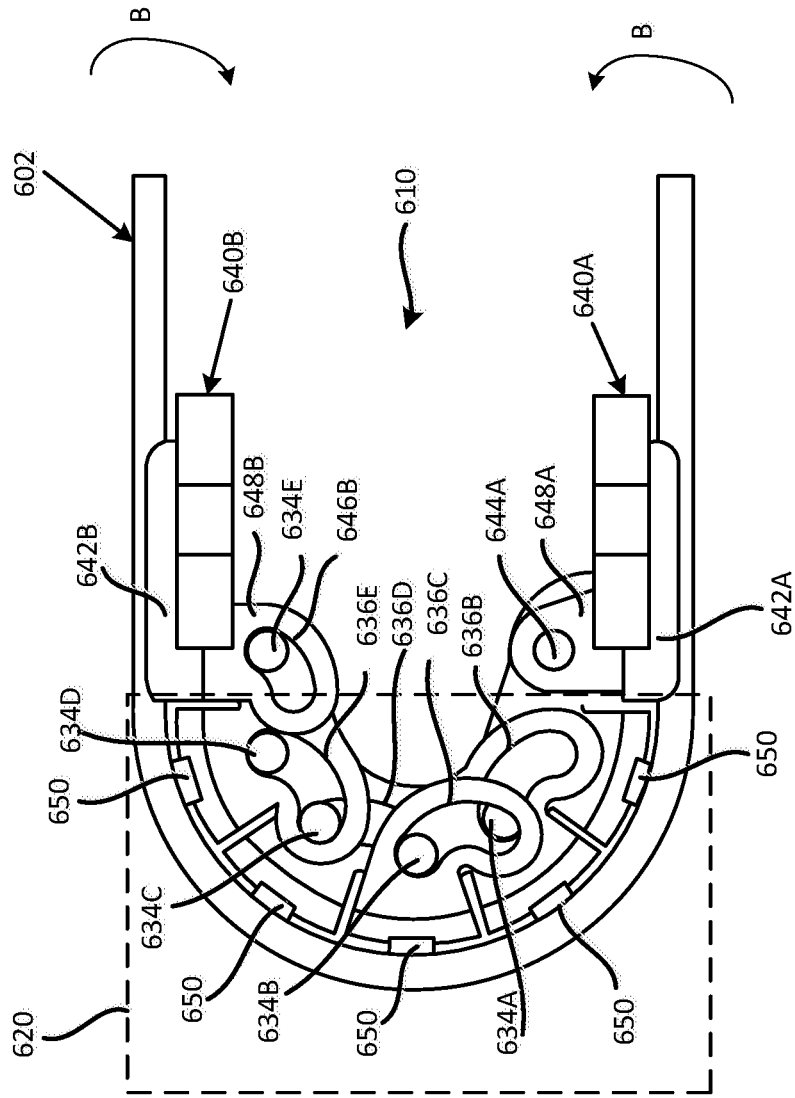
Figure 6D:
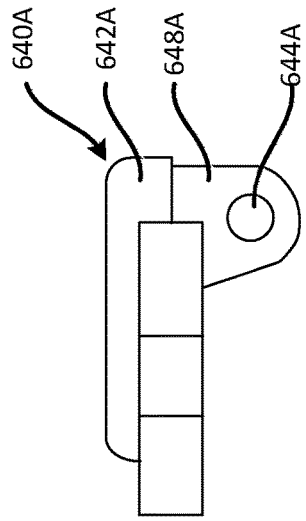
FIG. 6D is an end view of a first bracket.
Figure 6E:
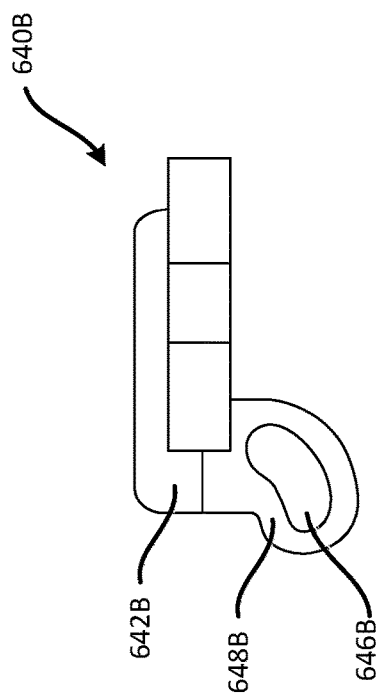
FIG. 6E is an end view of a second bracket, of the support device shown in FIGS. 6A and 6B, in accordance with implementations described herein.
Figure 6C:
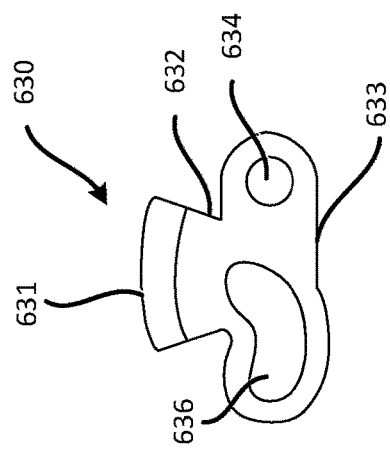
FIG. 6C is an end view of a link member of the support device shown in FIGS. 6A and 6B, in accordance with implementations described herein.

FIG. 6A is a side view of a support device 610 for a foldable layer 602, such as, for example, a foldable display 602, of a foldable device in accordance with implementations described herein. FIG. 6B is a side view of the exemplary support device 610 and the exemplary foldable layer 602, for example, a foldable display 602, in the folded configuration. In the exemplary support device 610 shown in FIGS. 6A and 6B, the support device 610 includes a plurality of links 630 (or segments or link members) (shown in the figures as links 630A-630E), wherein each of the plurality of links 630 is individually fixed to a surface of a foldable portion 616 (or bendable section) of the foldable layer 602. Each of the plurality of links 630 is movably coupled to an adjacent link of the plurality of links 630, such that the plurality of links 630 move relative to each other, while remaining fixed to the foldable layer 202, in response to a folding movement of the foldable layer 202 and an unfolding movement of the foldable layer 202. The support device 610 may include a chain module 620 including the plurality of links 630. An end view of one of the plurality of exemplary links 630 is shown in FIG. 6C. A first bracket 640A may be provided at a first end of the chain module 620, and a second bracket 640B may be provided at a second end of the chain module 620. End views of an exemplary first bracket 640A and an exemplary second bracket 640B are shown in FIGS. 6D and 6E, respectively.

Each link 630, may include a body 635 (see FIG. 6C) defining a coupling portion 632 fixed to the foldable layer 202. In some implementations, each link 630 may include a pin 634 (or shaft) extending outward substantially orthogonally from the coupling portion 632 and a slot 636 (or rail) formed in the coupling portion 632 and configured to slidably receive the pin 634 of an adjacent link 630 of the plurality of links 630. In some implementations, a first end portion 631 of the coupling portion 632 may be coupled, for example, fixedly coupled, to the foldable layer 602. A pin 634 may be coupled to a second end portion 633 of the coupling portion 632 and may extend outward from a first side portion of the second end portion 633 of the coupling portion 632. A slot 636, for example, an arcuate slot 636 as discussed above in detail with respect to FIGS. 3-5, may be formed in a second side portion of the second end portion 633 of the coupling portion 632. As shown in the sequential arrangement of links 630 illustrated in FIG. 6A, the pin 634 of one link 630 (for example, the pin 634A of the first link 630A) may be received in the slot 636 of the adjacent link 630 (for example, the slot 636B of the second link 630B), to sequentially engage the adjacent links 630. Thus, the pin(s) 634 and the slot(s) 636 may define a guide device, or guide structure, that couples adjacent links 630, and that guides the relative movement of the adjacent links 630 as the foldable layer 602 is folded and unfolded. Due to the structure of the slots 636, when the foldable layer 602, for example, a foldable display 602, is folded and unfolded, movement and positioning of the links 630 and a relationship between the chain module 620 and the foldable layer 602 may be controlled to provide support to the foldable layer 602 throughout the range of positions between the unfolded configuration shown in FIG. 6A and the folded position shown in FIG. 6B.

As noted above, the exemplary support device 610 shown in FIG. 6A includes five links 630 (links 630A, 630B, 630C, 630D and 630E, including pins 634A, 634B, 634C, 634D and 634E, and slots 636A, 636B, 636C, 636D and 636E, respectively) forming the chain module 620, simply for ease of discussion and illustration. In some implementations, the chain module 620 may include more, or fewer, links 630, arranged in a similar manner or in a different manner.

In the exemplary arrangement shown in FIGS. 6A and 6B, the first bracket 640A may include a base portion 642A that may be coupled, for example, fixedly coupled, to the foldable layer 602. A linking arm 648A may extend from the base portion 642A. A pin 644A coupled to the linking arm 648A may be received in the slot 636A formed in the adjacent link 630A, to engage the link 630A and the first bracket 640A. In the exemplary arrangement shown in FIGS. 6A and 6B, the second bracket 640B may include a base portion 642B that may be coupled, for example, fixedly coupled, to the foldable layer 602. A linking arm 648B may extend from the base portion 642B. A slot 646B may be defined in the linking arm 648B. The pin 634E of the adjacent link 630E may be received in the slot 646B formed in the second bracket 640B, to engage the link 630E and the second bracket 640B. In this manner, the chain module 620 and the first and second brackets 640A, 640B may be coupled, to form the support device 610. The exemplary support device 610 shown in FIGS. 6A and 6B includes the first bracket 640A having the pin 644A coupled thereto (for engagement with the slot 636A of the adjacent link 630A), and the second bracket 640B having the slot 646B formed therein (for engagement with the pin 634E of the adjacent link 630E). However, depending on, for example, the arrangement and/or the number of links 630 forming the chain module 620, the positioning of the first and second brackets 640A, 640B may be reversed.

As noted above, the plurality of links 630, and in particular, the first end portion(s) 631 of the coupling portion(s) 632 of the links 630, may be coupled, for example, fixedly coupled to the foldable layer 602 by a coupling mechanism 650. In some implementations, the coupling mechanism 650 may be, for example, an adhesive. Other types of coupling mechanisms, for example, with mechanical fasteners (e.g., screws, pins, etc.), and/or combinations of coupling mechanisms, may couple the links 630 to the foldable layer 602.

As shown in FIGS. 6A and 6B, due to the configuration of the slots 636 and the relative arrangement of the links 630, when the foldable layer 602, for example, a foldable display 602, is folded and unfolded, movement and positioning of the links 630, and a relationship between the chain module 620 and the foldable layer 602, may be controlled to provide support to the foldable layer 602 in the foldable portion 616 (or bendable section) throughout the range of positions between the unfolded configuration (shown in FIG. 6A) and the folded position (shown in FIG. 6B).

For example, in the unfolded configuration shown in FIG. 6A, the pin 634A of the first link 630A is positioned at a first end of the slot 636B of the second link 630B. In the folded configuration shown in FIG. 6B, with the pin 634A of the first link 630A positioned at a second end of the slot 636B of the second link 630B, the movement of the pin 634A in the slot 636B may in turn guide relative movement of the first and second links 630A, 630B as the foldable layer 602 moves from the unfolded to the folded configuration. Similarly, the pin 634B of the second link 630B moves from a first end to a second end of the slot 636C of the third link 630C; the pin 634C of the third link 630C moves from a first end to a second end of the slot 636D of the fourth link 630D; and the pin 634D of the link 630D moves from a first end to a second end of the slot 636E of the fifth link 630E, as the foldable layer 602 moves from the unfolded to the folded configuration.

As described above, in some implementations, a contour of the slots 636 may be defined based on a trace of the movement of foldable layer 602 as the foldable layer 602 moves between the unfolded and folded configurations. For example, by determining a trace of the movement of a center of rotation of an object on a foldable portion of the foldable layer when the foldable layer is moved between unfolded and folder configurations and then analyzing a portion of the trace to identify a configuration of the portion of the trace, the configuration or contour of the slots 636 can be determined based on the identified configuration of the trace, as described above with respect to FIGS. 3, 4A and 4B. In some implementations, the contour of the slots 636 may guide this movement so that a bending radius, or radius of curvature, of the foldable layer 602 in the foldable portion 616 or bending section 616 does not go below a minimum bending radius, such as a bending radius which small enough to result in damage to components of the foldable layer 602. For example, in some implementations, a shape of the slots 636 may guide movement of the foldable layer 602 so that a contour of the foldable portion 616 or bending section 616 of the foldable layer 602 remains within set parameters. In some implementations, a shape of each of the slots 636 of the plurality of links 630 may be substantially the same, so that the links 630 provide substantially uniform support to the foldable layer 602 as the foldable layer 602 is folded and unfolded. In some implementations, the contour of each of the slots 636 of the plurality of links 630 may be substantially the same, so that a substantially uniform bending of the bending section 616 of the foldable layer 602 is achieved as the foldable layer 602 is folded and unfolded.

In some implementations, a length of the slots 636 of the plurality of links 630 may be set so as to somewhat limit, or restrict (folding and unfolding) movement of the foldable layer 602 beyond set thresholds. For example, a length of the slots 636 (i.e., a travel distance of the pins 634 received in the respective slots 636) may be set so that, when each of the pins 634 is at the first end of the respective slot 636, as shown in FIG. 6A, the foldable layer 602 is in a fully unfolded position. With the pins 634 positioned against, or abutting, the first ends of the slots 636 as shown in FIG. 6A, the first ends of the slots 636 may restrict further bending, or rotation in the direction of the arrows A, and may prevent a maximum allowable bending radius from being exceeded. This may prevent bending in a direction in which the foldable display 602 is not designed to bend. For example, in the case in which the foldable layer 602 is a foldable display 602, this may prevent bending of the foldable layer 602 in a direction which could put components at the viewing surface 604 of the foldable display 602 in unintended/excessive compression (and/or components at an opposite surface 608 of the foldable display 602 in unintended/excessive tension) that may result in damage to the foldable display 602. Similarly, with the pins 634 positioned against the second ends of the slots 636 as shown in FIG. 6B, the second ends of the slots 636 may restrict further bending, or rotation in the direction of the arrows B, and may prevent a minimum allowable bending radius from being exceeded. In the case in which the foldable layer 602 is a foldable display 602, this may prevent excessive bending which would put the components at the viewing surface 604 in unintended/excessive tension (and/or components at the opposite surface 608 of the foldable display 602 in unintended/excessive compression) that may result in damage to the foldable display 602.

In some implementations, a contour, or peripheral shape, of the first end portion 631 of the coupling portion 632 of the link 630 may be shaped to correspond to a bent, or folded shape or contour of the foldable layer 602. For example, as shown in FIG. 6B, the peripheral shape or contour of the first end portion 631 of the coupling portion 632 of each of the links 630 may be shaped (e.g. arcuate, curved, etc.) so that, in the folded configuration, the links 630 may provide substantially uniform physical support to the foldable layer 602. In some implementations, this shaping or contouring of the links 630 in this manner may help to limit, or restrict, an amount of rotation in the direction of the arrow B.

Figure 7:
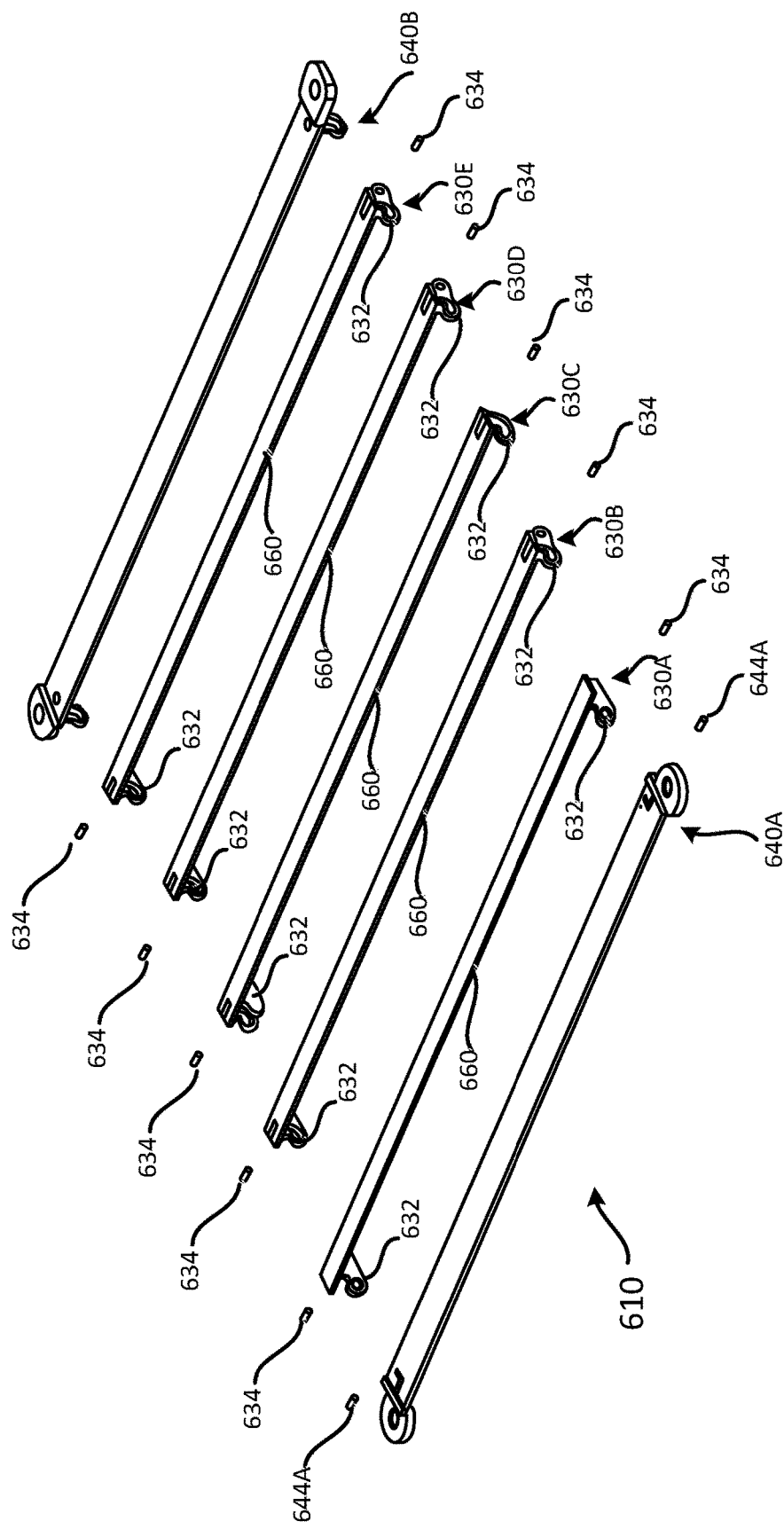
FIG. 7 is an exploded perspective view.
Figure 8:
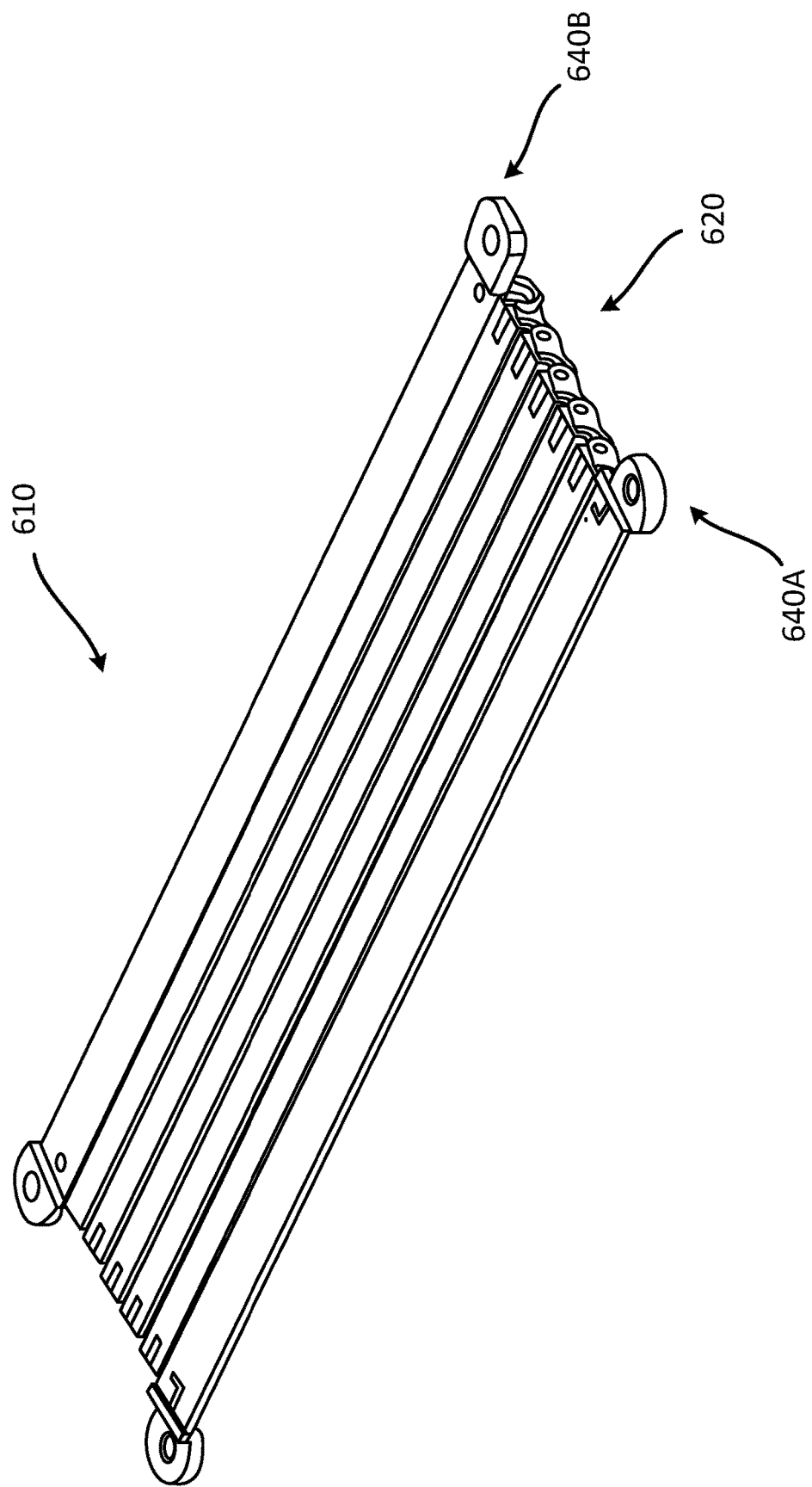
FIG. 8 is an assembled perspective view, of the support device shown in FIGS. 6A-6E, in accordance with implementations described herein.
Figure 9:
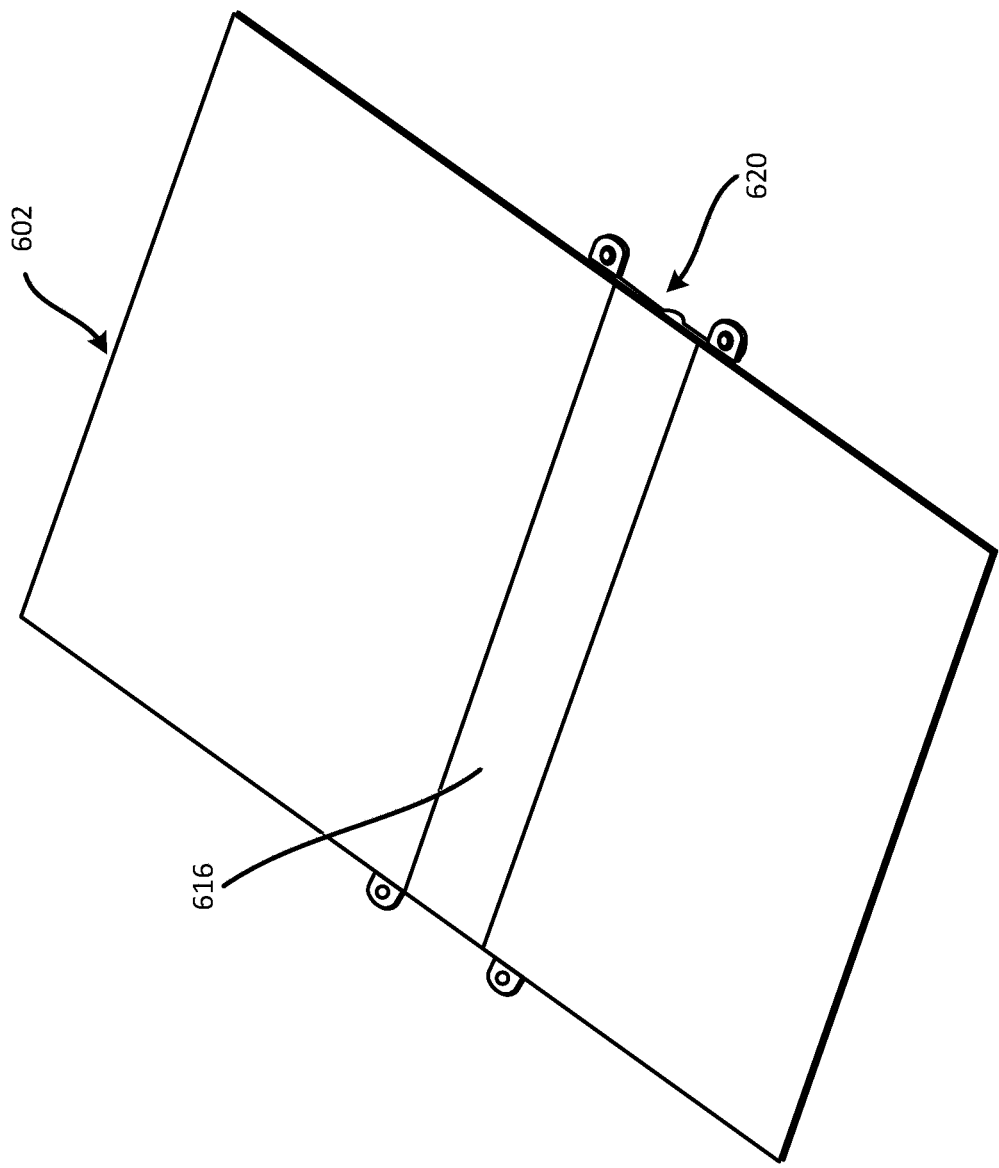
FIG. 9 is a perspective view of a support device coupled to an exemplary foldable layer, in accordance with implementations described herein.

FIG. 7 is an exploded perspective view, and FIG. 8 is an assembled perspective view, of the support device 610 shown in FIGS. 6A-6E, in accordance with implementations described herein. FIG. 9 is a perspective view of the support device 610 coupled to the foldable layer 602, in accordance with implementations described herein.

As shown in FIGS. 7-9, each of the links 630, or link members 630, may include a support member 660 extending between a first edge portion of the foldable layer 602 and a second edge portion of the foldable layer 602, with a first coupling portion 632 at a first end of the support member 660, and second coupling portion 632 at a second end of the support member 660. In some implementations, the support member 660 of each link 630 may be positioned against, or adjacent to, or proximate, the surface 608 of the foldable layer 602. Some or all or the support members 660 also can be attached to the foldable layer 602. In some implementations, each of the support members 660 may provide for support of the foldable portion 616 or bending section 616 of the foldable layer 602, essentially from a first end to a second end of the foldable layer 602. In some implementations, the connection between the first and second coupling portions 632 provided by the support members 660 may provide for coordinated movement of the individual elements (i.e., the links 630, or link members 630) of the chain module 620 at the first end of the foldable layer 602 and the individual elements of the chain module 620 at the second end of the foldable layer 602.

In a support device for a foldable layer such as a foldable display, in accordance with implementations described herein, the support device may provide substantially uniform support to a bending section of the foldable layer through a range of the bending radius of the bending section. The support device may include a guide device that guides bending (folding and unfolding) of the foldable layer, and that may limit the bending of the foldable layer to within a range between a maximum bending radius and a minimum bending radius. For example, the arrangement of the slots and pins of the links described in the example implementations herein guides bending (folding and unfolding) of the foldable layer, and may limit the bending of the foldable layer to within a range between a maximum bending radius and a minimum bending radius. By having a support device including a plurality of links, with each link individually fixed to a surface of the foldable portion of the foldable layer and moveably coupled to an adjacent link such that the plurality of links move relative to each other while remaining fixed to the foldable layer, the described arrangement provides support for the foldable layer whilst ensuring there is no relative movement between the support device and the foldable layer. By avoiding relative movement between the support device and foldable layer, damage to the foldable layer by the support device as the foldable layer is folded and unfolded can be avoided or at least reduced. The foldable device described herein may be any computing device that is foldable and has a foldable layer, such as a television, smart phone, tablet, portable computer and similar foldable devices. The foldable layer may be a display or other user interface such as a keyboard.

The devices and apparatuses described herein can be included as part of a computing device, that includes, for example, a processor for executing instructions and a memory for storing the executable instructions. Specific structural and functional details disclosed herein are merely representative for purposes of describing example embodiments. Example embodiments, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term and/or includes any and all combinations of one or more of the associated listed items.

It will be understood that when an element is referred to as being connected or coupled to another element, it can be directly connected or coupled to the other element or intervening elements may be present. In contrast, when an element is referred to as being directly connected or directly coupled to another element, there are no intervening elements present. Other words used to describe the relationship between elements should be interpreted in a like fashion (e.g., between versus directly between, adjacent versus directly adjacent, etc.).

The terminology used herein is for the purpose of describing particular embodiments only and is not intended to be limiting of example embodiments. As used herein, the singular forms a, an and the are intended to include the plural forms as well, unless the context clearly indicates otherwise. It will be further understood that the terms comprises, comprising, includes and/or including, when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

It should be borne in mind, however, that all of these and similar terms are to be associated with the appropriate physical quantities and are merely convenient labels applied to these quantities. Unless specifically stated otherwise, or as is apparent from the discussion, terms such as processing or computing or calculating or determining of displaying or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Lastly, it should also be noted that whilst the accompanying claims set out particular combinations of features described herein, the scope of the present disclosure is not limited to the particular combinations hereafter claimed, but instead extends to encompass any combination of features or embodiments herein disclosed irrespective of whether or not that particular combination has been specifically enumerated in the accompanying claims at this time.

What is claimed is:

1. A foldable device, comprising:
a foldable layer comprising a foldable display; and
a support device fixed to a foldable portion of the foldable layer, the support device including a plurality of links, wherein
each of the plurality of links is individually fixed to a surface of the foldable portion of the foldable layer via adhesive, wherein each link of the plurality of links includes a coupling portion fixed to the foldable layer, and wherein, for each link of the plurality of links,
a first end portion of the coupling portion is fixedly coupled to the foldable layer, and
a convex contour of the first end portion is shaped to correspond to a concave contour of the foldable layer in a folded position, wherein the convex contour of the first end portion is fixedly coupled to the foldable layer via the adhesive, and wherein, when the foldable device is in the folded position, the foldable layer is on an outside of the support device, and
each of the plurality of links is movably coupled to an adjacent link of the plurality of links, such that the plurality of links move relative to each other, while remaining fixed to the foldable layer, in response to a folding movement of the foldable layer and an unfolding movement of the foldable layer, wherein the support device includes:
a chain module including the plurality of links;
a first bracket fixed to the foldable layer at a first end portion of the chain module; and
a second bracket fixed to the foldable layer at a second end portion of the chain module,
the first bracket includes:
a base portion fixedly coupled to the foldable layer;
a linking arm extending outward from the base portion; and
a slot formed in the linking arm and configured to receive a pin of an adjacent link at the first end portion of the chain module, and
the second bracket includes:
a base portion fixedly coupled to the foldable layer;
a linking arm extending outward from the base portion; and
a pin extending outward from the linking arm and configured to engage the slot of an adjacent link at the second end portion of the chain module.

2. The device of claim 1, wherein each link of the plurality of links includes:
a pin extending outward from the coupling portion; and
a slot formed in the coupling portion and configured to slidably receive the pin of an adjacent link of the plurality of links.

3. The device of claim 2, wherein, for each link of the plurality of links,
the pin extends outward, substantially orthogonally, from a first side portion of a second end portion of the coupling portion; and
the slot is an arcuate slot formed in a second side portion of the second end portion of the coupling portion, so as to guide movement of the pin of the adjacent link through a folding and an unfolding of the foldable layer.

4. The device of claim 2, wherein, each link of the plurality of links is configured such that:
in an unfolded position of the foldable layer, the pin is slidably received in the slot of the adjacent link and the pin is positioned at a first end of the slot formed in the adjacent link; and
in the folded position of the foldable layer, the pin is slidably received in the slot of the adjacent link and the pin is positioned at a second end of the slot formed in the adjacent link.

5. The device of claim 1, wherein each link of the plurality of links includes:
a support member extending between a first edge portion of the foldable layer and a second edge portion of the foldable layer;
a first coupling portion at a first end of the support member; and
a second coupling portion at a second end of the support member.

6. The device of claim 5, wherein the first coupling portion and the second coupling portion each include:
a first end portion fixedly coupled to the foldable layer;
a second end portion opposite the first end portion;
a pin extending outward from the second end portion; and
an arcuate slot formed in the second end portion and configured to slidably receive the pin of an adjacent link of the plurality of links, so as to guide movement of the pin of the adjacent link through a folding and an unfolding of the foldable layer.

7. The device of claim 6, wherein each link of the plurality of links is configured such that:
in an unfolded position of the foldable layer, the pin is slidably received in the slot of the adjacent link and the pin is positioned at a first end of the slot formed in the adjacent link; and
in the folded position of the foldable layer, the pin is slidably received in the slot of the adjacent link and the pin is positioned at a second end of the slot formed in the adjacent link.

8. The device of claim 7, wherein the slot is configured such that the position of the pin at the first end of the slot restricts further unfolding movement of the foldable layer, and the position of the pin at the second end of the slot restricts further folding movement of the foldable layer.

9. The device of claim 1, wherein the support device is configured to prevent the foldable layer from bending beyond a minimum bending radius.

10. The device of claim 1, wherein the support device is configured to prevent the foldable layer from bending beyond a maximum bending radius.

11. A foldable display device, comprising:
a foldable organic light emitting diode (OLED) display layer; and
a support device fixed to a foldable portion of the foldable OLED display layer, wherein the support device is configured to prevent the foldable OLED display layer from bending beyond a minimum bending radius, the support device including a plurality of links, wherein
each of the plurality of links is individually fixed to a surface of the foldable portion of the foldable OLED display layer, wherein each link of the plurality of links includes a coupling portion fixed to the foldable OLED display layer, and wherein, for each link of the plurality of links,
a first end portion of the coupling portion is fixedly coupled to the foldable OLED display layer, and
a convex contour of the first end portion is shaped to correspond to a concave contour of the foldable OLED display layer in a folded position, and
each of the plurality of links is movably coupled to an adjacent link of the plurality of links, such that the plurality of links move relative to each other, while remaining fixed to the foldable OLED display layer, in response to a folding movement of the foldable OLED display layer and an unfolding movement of the foldable OLED display layer,
and wherein the support device includes:
a chain module including the plurality of links;
a first bracket fixed to the foldable OLED display layer at a first end portion of the chain module, wherein the first bracket includes:
a base portion fixedly coupled to the foldable OLED display layer;
a linking arm extending outward from the base portion; and
a slot formed in the linking arm and configured to receive a pin of an adjacent link at the first end portion of the chain module; and
a second bracket fixed to the foldable OLED display layer at a second end portion of the chain module, the second bracket includes:
a base portion fixedly coupled to the foldable OLED display layer;
a linking arm extending outward from the base portion; and
a pin extending outward from the linking arm and configured to engage the slot of an adjacent link at the second end portion of the chain module.

12. The device of claim 11, wherein each link of the plurality of links includes:
 a pin extending outward from the coupling portion; and
 a slot formed in the coupling portion and configured to slidably receive the pin of an adjacent link of the plurality of links.

13. The device of claim 12, wherein, for each link of the plurality of links,
 the pin extends outward, substantially orthogonally, from a first side portion of a second end portion of the coupling portion; and
 the slot is an arcuate slot formed in a second side portion of the second end portion of the coupling portion, so as to guide movement of the pin of the adjacent link through a folding and an unfolding of the foldable OLED display layer.

14. The device of claim 12, wherein, each link of the plurality of links is configured such that:
 in an unfolded position of the foldable OLED display layer, the pin is slidably received in the slot of the adjacent link and the pin is positioned at a first end of the slot formed in the adjacent link; and
 in the folded position of the foldable OLED display layer, the pin is slidably received in the slot of the adjacent link and the pin is positioned at a second end of the slot formed in the adjacent link.

15. The device of claim 11, wherein each link of the plurality of links includes:
 a support member extending between a first edge portion of the foldable OLED display layer and a second edge portion of the foldable OLED display layer;
 a first coupling portion at a first end of the support member; and
 a second coupling portion at a second end of the support member.

16. The device of claim 15, wherein the first coupling portion and the second coupling portion each include:
 a first end portion fixedly coupled to the foldable OLED display layer;
 a second end portion opposite the first end portion;
 a pin extending outward from the second end portion; and
 an arcuate slot formed in the second end portion and configured to slidably receive the pin of an adjacent link of the plurality of links, so as to guide movement of the pin of the adjacent link through a folding and an unfolding of the foldable OLED display layer, and
 wherein each link of the plurality of links is configured such that:
  in an unfolded position of the foldable OLED display layer, the pin is slidably received in the slot of the adjacent link and the pin is positioned at a first end of the slot formed in the adjacent link; and
  in the folded position of the foldable OLED display layer, the pin is slidably received in the slot of the adjacent link and the pin is positioned at a second end of the slot formed in the adjacent link.

* * * * *